United States Patent [19]

Olivera

[11] Patent Number: 4,556,274
[45] Date of Patent: Dec. 3, 1985

[54] FUSE AND MOUNTING ARRANGEMENT FOR PRINTED CIRCUIT BOARD APPLICATION

[75] Inventor: Raul Olivera, Hoffman Estates, Ill.

[73] Assignee: Motorola, Inc., Schaumburg, Ill.

[21] Appl. No.: 564,041

[22] Filed: Dec. 21, 1983

[51] Int. Cl.[4] ................................. H01R 11/22
[52] U.S. Cl. ............................. 339/147 R; 339/258 F
[58] Field of Search ........... 339/147 R, 147 P, 256 C, 339/258 F, 220 R, 221 R, 221 M, 221 L, 198 R

[56] References Cited

U.S. PATENT DOCUMENTS

| | | | |
|---|---|---|---|
| 2,777,118 | 1/1957 | Sundt | 339/221 R |
| 2,958,063 | 10/1960 | Stanwyck | 339/17 |
| 3,076,172 | 1/1963 | Carr et al. | 339/258 |
| 3,162,721 | 12/1964 | Rayburn | 174/68.5 |
| 3,317,652 | 5/1967 | Johannessen et al. | 174/68.5 |
| 3,492,628 | 1/1970 | Matthews | 339/258 F |
| 3,634,812 | 1/1972 | Genova | 339/258 F |
| 3,673,551 | 6/1972 | McDonough | 339/258 R |
| 3,733,574 | 5/1973 | Scoville et al. | 339/18 C |
| 3,871,738 | 3/1975 | Dechelette | 339/256 C |
| 4,037,912 | 7/1977 | Besser et al. | 339/198 R |
| 4,097,109 | 6/1978 | Cross | 339/258 F |
| 4,176,906 | 12/1979 | Urani | 339/258 F |
| 4,391,485 | 7/1983 | Urani | 339/147 R |
| 4,460,239 | 7/1984 | Inoue | 339/258 F |

FOREIGN PATENT DOCUMENTS 1110012 4/1968 United Kingdom ............ 339/258 F

Primary Examiner—Gil Weidenfeld
Assistant Examiner—Gary F. Paumen
Attorney, Agent, or Firm—Edward M. Roney; Donald B. Southard

[57] ABSTRACT

An improved fuse and mounting arrangement is disclosed especially suited for mounting on a printed circuit board or the like. The fuse device itself is of the two-bladed type for reinserting in an individual fuse holder. The holder is formed of a thermo setting plastic with a high resistance to heat. End positioned cavities in the holder are dimensioned to receive conductive terminals which accommodate the fuse blades and which holder further includes leg portions extending downwardly for appropriate attachment to the associated printed circuit board, such as by soldering or the like.

4 Claims, 3 Drawing Figures

FUSE AND MOUNTING ARRANGEMENT FOR PRINTED CIRCUIT BOARD APPLICATION

BACKGROUND OF THE INVENTION

This invention relates in general to miniaturized fuse devices and, more particularly, to such an arrangement which is specifically designed for, and mounting on, printed circuit boards and the like.

In the past, when fuse devices are necessary for circuitry on the printed circuit (PC) board, the most common practice has been to utilize the more well known glass tube type device which is cylindrical in shape with two metal caps at each end and having a glass tube in between in which a fuse element is longitudinally positioned. To maintain the fuse device on the PC board, separate lock-in terminal devices must be employed and mounted to surface area in which the glass tube fuse may be snapped in place at respective ends and retained therein.

There are several undesirable features concerning the utilization of these glass tube fuses in conjunction with the printed circuit board application. They take up much too much space relative to the PC board itself. They are somewhat difficult to insert in their associated end terminals. Being in large part constructed of glass, they are inherently fragile and if broken may be dangerous to an individual attempting to remove them from their terminal holders. Indeed, to use the fingers to attempt removal of the fuse device under any circumstances subjects the individual to a shock hazard as long as the surrounding circuitry is energized. For safe removal, a specialized, non-metallic tool is required.

One additional drawback to the glass tube fuse is its cost. In order that the associated end terminals retain their required spring tension capability over the expected service life, high tensile material, such as heat treated copper or copper-berillium alloy must be used, thereby contributing to high manufacturing costs. Moreover, the end terminals are difficult to properly attach to the PC board by the conventional wave soldering process. They frequently move or shift in location during the wave soldering process causing difficulty for later use.

There are, of course, alternatives to the cylindrical glass tube fuse device. One such alternative is a blade type fuse such as that shown at 14 in FIG. 2. It is highly compact, easy to grasp with the fingers at a location electrically isolated from shock and designed for convenient insertion and removal without special tools. This blade fuse device has a major application in automotive environments and is intended to plug in to a central connector block with other devices under the dash or the like. The problem with this blade fuse and others of its type is that it is not designed for application on PC boards. Not only must there be an associated holder arrangement for individual fuses, but the holder must be such as to hold firm during wave soldering applications but at the same time be easily mounted before being permanently attached to the board, and other considerations.

SUMMARY OF THE INVENTION

Accordingly, it is an object of the present invention to provide an improved fuse and mounting arrangement for use on a printed circuit board which overcomes the foregoing deficiencies.

Another more particular object of the present invention is to provide a PC board mounted fuse device which conveniently may be inserted or removed by hand in its holder, is sturdy, non-breakable construction, and optimizes the required space on the board.

Still another object of the present invention is to provide a fuse device and associated mounting holder which is simple in construction, reliable in operation, and cost effective in manufacture.

In practicing the invention, an improved miniature fuse device and mounting arrangement is provided which is especially suited for use on a printed circuit board or the like. The arrangement includes a fuse holder of rigid, non-conductive material in which conductive terminals are retained at respective ends thereof. The terminals include leg portions extending downwardly which are intended for mounting to the associated PC board. A fuse block of transparent non-conductive material is provided in which a pair of conductive blades are embedded and extend downwardly a predetermined distance therefrom. A fusable link is bridged between the blades internal of the fuse block which is selected to be of the desired current carrying capacity.

BRIEF DESCRIPTION OF THE DRAWINGS

The features of the present invention which are believed to be novel are set forth with particularity in the appended claims. The invention itself, however, together with further objects and advantages thereof may be best understood by reference to the following description when taken in conjunction with the accompanying drawings, in which:

DESCRIPTION OF THE PREFERRED EMBODIMENT

Figure 1:
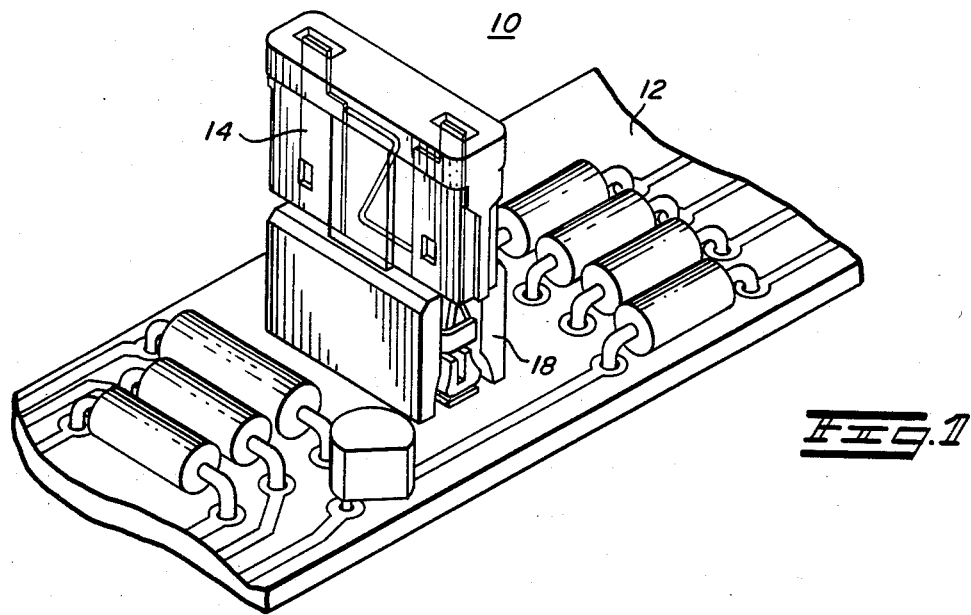
FIG. 1 is a view in perspective of a blade fuse device and associated fuse holder mounted on a printed circuit board, which arrangement is in accordance with the present invention.
Figure 2:
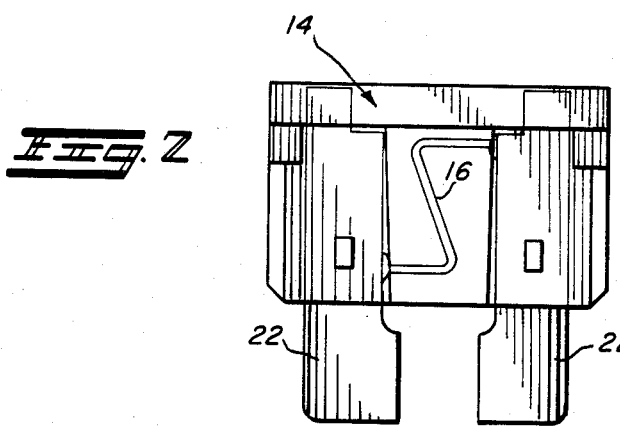
FIG. 2 is an enlarged exploded view in elevation of the fuse device and holder of FIG. 1.
Figure 3:
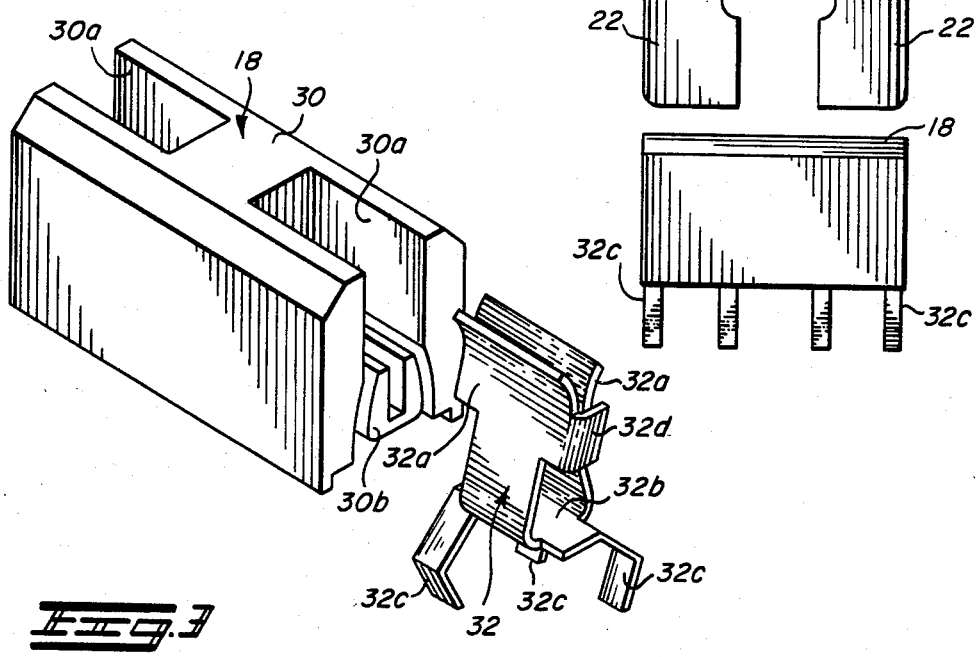
FIG. 3 is an enlarged view in perspective of the fuse holder and one of the associated end terminals separated therefrom.

Referring now to the drawing, an improved blade fuse and holder arrangement 10 is shown in FIG. 1 which has been constructed in accordance with the present invention. Included in the arrangement is a fuse block 14 which contains the fusable element 16 and a separate holder 18 intended for mounting to the PC board 12, as indicated, into which the fuse device 14 may be inserted and operatively maintained therein.

The fuse block 14 may be advantageously comprised of a non-conductive, transparent material, such as thermosetting plastic, in which a pair of spaced apart blades or spade lugs 22 are partially embedded therein. The fusable link 16 may be bridged thereacross. It may be soldered, welded or otherwise suitably attached in the manner shown. The link is to be chosen to exhibit the desired current carrying capacity. The blades 22 extend downwardly from the fuse block 14 to a predetermined length as shown.

The associated fuse holder comprises a housing 30 formed of a suitable rigid, non-conductive material such as Noryl, a thermosetting plastic with a high resistance to heat, which is necessary to withstand the temperatures encountered during wave soldering processes. A pair of conductive terminals 32 are received and retained at respective end locations in the holder. The end terminals 32 are preferrably formed with upstanding curved walls 32a flaring slightly outwardly at the top and an essentially flat base 32b connects the bottom of the walls 32a to form a flat base. Angled leg portions 32c extend downwardly in the manner shown. These leg portions are intended for inserting in the corresponding mounting apertures (not shown) in the PC board and are suitably attached, such as by wave soldering or the like. A lateral tab 32d on one of the walls 32a extends across to the other wall to complete the assembly. Tab 32d further serves to control how far into the housing interior the associated terminal 32 may be inserted during final assembly.

The terminal 32 is inserted into an open ended cavity 30a of the holder 30. The opening formed by the terminal bottom 32b and the upstanding walls 32a slides over a suitably shaped lateral bar member 30b of the holder 30. As mentioned previously, the tab portions 32d of the terminal 32 determined how far into the respective cavities 30a they may be inserted. This further assures the proper spacing between the terminals for accommodating the blade connector 22 of fuse 14.

The holder also permits the use of a medium tensile strength conductive material, such as copper alloy, instead of the more usual high tensile strength heat treated copper since the terminals are effectively retained in and reenforced by the housing body itself. Accordingly, such an arrangement effectively prevents any significant deformation of the terminals from occurring when inserting and/or removing the fuse blades 22 of device 14. This significantly reduces the manufacturing cost.

Accordingly, what is claimed is:

1. An improved miniature fuse device and mounting arrangement adapted for use on a printed circuit board, comprising on combination:
   a holder of rigid, non-conductive material having cavities at respective ends thereof each being open at its respective top, bottom and end sidewall, said holder further having an arm within each of said cavities extending laterally to a position adjacent its respective open end sidewall;
   first and second end terminals of conductor material which are each slid through a respective one of said open end sidewalls and around a respective one of said lateral arms for retention in the interior of said holder on said laterally extending arms in said respective cavities, said end terminals having leg portions extending through said open bottom for mounting to the printed circuit board; and
   a fuse block of transmparent non-conductive material having a pair of spaced apart partially embedded blades extending downwardly therefrom together with a fuse link of the desired current carrying capacity electrically bridged across said blades within said fuse block,
   said blades being adapted for releasably inserting into and being retained by friction fit within said respective end terminals in said fuse holder.

2. A fuse holder in accordance with claim 1, when the holder is constructed of a thermosetting plastic with a high resistance to heat.

3. A fuse holder in accordance with claim 1, wherein the end terminals are formed of a medium tensile, non-heated copper alloy.

4. A fuse holder in accordance with claim 1, wherein the end terminals are formed with a base having vertically upstanding walls extending upwardly and flaring outwardly at the top.

5. A fuse holder especially adapted for mounting on a printed circuit board and accommodate a blade fuse device, comprising in combination:
   a holder body of rigid, non-conductive material having cavities at respective ends thereof each being open at its respective top, bottom and end sidewall, said holder further having an arm member within each of said cavities extending laterally to a position adjacent its respective open end sidewall;
   first and second end terminals of conductive material which are each slid through a respective one of said open end sidewalls and around a respective one of said lateral arms for retention in the interior of said holder on said laterally extending arm members in said respective cavities and adapted to operatively receive the blade fuse device,
   said end terminals including angled leg portions extending downwardly thru said open bottom for attachment to the associated printed circuit board.

* * * * *